(12) United States Patent
Park

(10) Patent No.: US 9,355,969 B2
(45) Date of Patent: May 31, 2016

(54) SEMICONDUCTOR PACKAGE

(71) Applicant: Samsung Electronics Co., Ltd., Suwon-si (KR)

(72) Inventor: Young-woo Park, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/723,721

(22) Filed: May 28, 2015

(65) Prior Publication Data

US 2016/0071810 A1 Mar. 10, 2016

(30) Foreign Application Priority Data

Sep. 5, 2014 (KR) .......................... 10-2014-0119369

(51) Int. Cl.
  *H01L 23/552* (2006.01)
  *H01L 23/58* (2006.01)
  *H01L 23/522* (2006.01)
  *H01L 23/528* (2006.01)
  *H01L 25/065* (2006.01)

(52) U.S. Cl.
  CPC ............ *H01L 23/58* (2013.01); *H01L 23/5226* (2013.01); *H01L 23/5286* (2013.01); *H01L 25/0657* (2013.01)

(58) Field of Classification Search
  CPC ... H01L 23/50; H01L 23/552; H01L 23/3128; H01L 23/4334; H01L 24/97; H01L 24/24; H01L 25/0657
  USPC .................................. 257/659, 660, 777, 704
  See application file for complete search history.

(56) References Cited

U.S. PATENT DOCUMENTS

| 5,789,810 | A  | * | 8/1998  | Gross    | H01L 21/4817   |
|           |    |   |         |          | 257/697        |
| 6,472,741 | B1 | * | 10/2002 | Chen     | H01L 23/3128   |
|           |    |   |         |          | 257/659        |
| 6,538,319 | B2 |   | 3/2003  | Terui    |                |
| 6,740,959 | B2 |   | 5/2004  | Alcoe et al. |            |
| 6,838,761 | B2 | * | 1/2005  | Karnezos | H01L 23/3128   |
|           |    |   |         |          | 257/659        |
| 7,198,987 | B1 | * | 4/2007  | Warren   | H01L 23/552    |
|           |    |   |         |          | 257/E23.114    |
| 7,772,046 | B2 | * | 8/2010  | Pagaila  | H01L 23/29     |
|           |    |   |         |          | 257/E21.502    |
| 7,880,275 | B2 | * | 2/2011  | Pagaila  | H01L 21/568    |
|           |    |   |         |          | 257/659        |
| 8,039,316 | B2 | * | 10/2011 | Chi      | H01L 23/3677   |
|           |    |   |         |          | 257/678        |
| 8,039,930 | B2 |   | 10/2011 | Liao et al. |            |
| 8,138,024 | B2 |   | 3/2012  | Do et al. |             |
| 8,614,120 | B2 |   | 12/2013 | Yang     |                |
| 8,829,667 | B2 |   | 9/2014  | Park et al. |            |
| 2004/0238857 | A1 | * | 12/2004 | Beroz | H01F 17/0033 |
|           |    |   |         |          | 257/232        |
| 2009/0302435 | A1 | * | 12/2009 | Pagaila | H01L 21/561 |
|           |    |   |         |          | 257/659        |

(Continued)

FOREIGN PATENT DOCUMENTS

| JP | 4489575 | 6/2010 |
| JP | 4630746 | 2/2011 |

(Continued)

Primary Examiner — Nitin Parekh
(74) *Attorney, Agent, or Firm* — Onello & Mello LLP

(57) ABSTRACT

A semiconductor package includes a package substrate including a ground pad; a a conductive spacer and a first semiconductor chip disposed on the package substrate; a second semiconductor chip on the conductive spacer and the first semiconductor chip; a molding unit that covers the package substrate, the first semiconductor chip, the second semiconductor chip, and a first portion of the conductive spacer, and exposes a second portion of the conductive spacer; and an electromagnetic interference (EMI) shield that covers the molding unit.

20 Claims, 18 Drawing Sheets

(56) References Cited

U.S. PATENT DOCUMENTS

| | | | |
|---|---|---|---|
| 2010/0244217 A1* | 9/2010 | Ha | H01L 23/13 257/686 |
| 2011/0298109 A1* | 12/2011 | Pagaila | H01L 21/56 257/660 |
| 2012/0104571 A1 | 5/2012 | Yoo | |
| 2012/0228751 A1 | 9/2012 | Song | |
| 2013/0221500 A1 | 8/2013 | Zhao et al. | |

FOREIGN PATENT DOCUMENTS

| KR | 2008004731 | 1/2008 |
|---|---|---|
| KR | 100887638 | 3/2009 |
| KR | 101332332 | 11/2013 |

* cited by examiner

SEMICONDUCTOR PACKAGE

CROSS-REFERENCE TO RELATED APPLICATION

This application claims the benefit of Korean Patent Application No. 10-2014-0119369, filed on Sep. 5, 2014, in the Korean Intellectual Property Office, the disclosure of which is incorporated herein in its entirety by reference.

BACKGROUND

Embodiments of the inventive concept relate to a semiconductor package, and more particularly, to a semiconductor package including an electromagnetic interference (EMI) shield that protects a semiconductor chip and other components included in the semiconductor package and for shielding electromagnetic waves.

Recently, the demand for mobile devices has rapidly increased in the electronic device markets. Accordingly, there is an ongoing demand for electronic components mounted in mobile devices to be small and lightweight. In order to satisfy this demand, it is necessary to not only develop technology for reducing respective sizes of mounted components, but also develop semiconductor packaging technology for integrating the mounted components into a single package. In particular, semiconductor packages that use high frequency signals need to be small as well as include various EMI shields to provide excellent resistance against electromagnetic interference or electromagnetic waves.

SUMMARY

The inventive concept provides a semiconductor package that is small, lightweight, simple, and includes an electromagnetic interference (EMI) shield structure that has excellent resistance against electromagnetic interference.

According to an aspect of the inventive concept, there is provided a semiconductor package including a package substrate comprising a ground pad; a conductive spacer and a first semiconductor chip disposed on the package substrate; a second semiconductor chip on the conductive spacer and the first semiconductor chip; a molding unit that covers the package substrate, the first semiconductor chip, the second semiconductor chip, and a first portion of the conductive spacer, and exposes a second portion of the conductive spacer; and an electromagnetic interference (EMI) shield that covers the molding unit.

The second portion of the conductive spacer may be electrically connected to the EMI shield.

A lower surface of the conductive spacer may be electrically connected to the ground pad.

The semiconductor package may further include an adhesive disposed around the ground pad and attaching the conductive spacer to the package substrate.

A height of the conductive spacer may be the same as a height of the first semiconductor chip.

The package substrate may be a double-sided printed circuit board.

The EMI shield may cover the external surface of the molding unit and a side surface of the package substrate.

A portion of the conductive spacer may overlap the second semiconductor chip.

The first semiconductor chip may be a controller chip.

The semiconductor package may further include a connection terminal that is attached to a lower surface of the package substrate and electrically connected to another ground pad.

According to another aspect of the inventive concept, there is provided a semiconductor package including a package substrate comprising a ground pad; a conductive unit on the spacer; a first semiconductor chip disposed on the package substrate such that the first semiconductor chip is separated from the spacer; a second semiconductor chip on the spacer and the first semiconductor chip; a molding unit that covers the package substrate, the first semiconductor chip, the second semiconductor chip, and a first portion of the spacer, and a exposes a second portion of the conductive unit; and an electromagnetic interference (EMI) shield that covers an external surface of the molding unit.

The second portion of the conductive unit may be covered by the EMI shield.

The semiconductor package may further include a bonding wire that electrically connects the conductive unit and the ground pad.

The semiconductor package may further include a ground via that is formed inside the package substrate and electrically connected to the ground pad.

The EMI shield may cover the external surface of the molding unit and a side surface of the package substrate.

According to another aspect of the inventive concept, there is provided a semiconductor package, comprising: a package substrate; a first semiconductor chip on the package substrate; a conductive spacer comprising a conductive material, and adjacent the first semiconductor chip on the package substrate; a second semiconductor chip on the first semiconductor chip and a first portion of the conductive spacer; and an electromagnetic interference (EMI) shield about the package substrate, the first semiconductor chip, the second semiconductor chip, and the conductive spacer, and electrically connecting to a second portion of the conductive spacer, such that the conductive spacer provides a ground path for the EMI shield.

The semiconductor package may further comprise a molding unit under the EMI shield. The molding unit may cover the package substrate, the first semiconductor chip, the second semiconductor chip, and the first portion of the conductive spacer, and exposing the second portion of the conductive spacer.

The semiconductor package may further comprise a first ground pad at a first side of the package substrate electrically connected to the conductive spacer, a second ground pad on a second side of the package substrate opposite the first side, and a ground via extending through the package substrate between the first ground pad and the second ground pad for electrically connecting the ground pad and the ground pad.

The semiconductor package may further comprise a connection terminal that is attached to a lower surface of the package substrate and electrically connected to the second ground pad.

A portion of the conductive spacer may overlap the second semiconductor chip.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
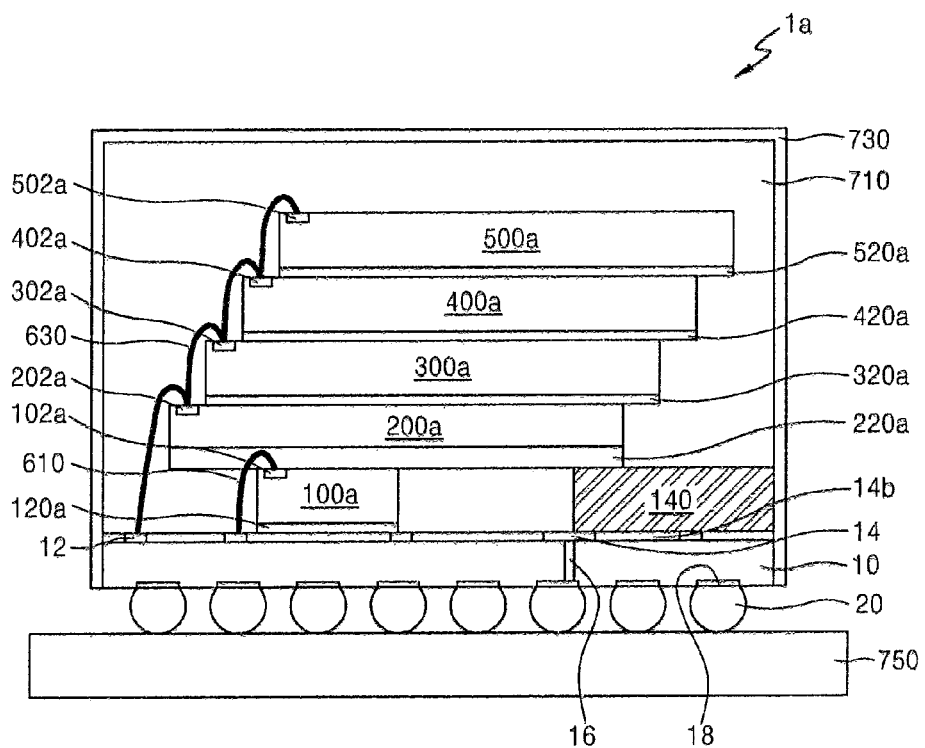
FIG. 1 is a cross-sectional view of a semiconductor package attached to a main board, according to an exemplary embodiment.

The inventive concept will be described more fully with reference to the accompanying drawings, in which exemplary embodiments of the inventive concept are shown. This inventive concept may, however, be embodied in many different forms and should not be construed as being limited to the exemplary embodiments set forth herein. Rather, these embodiments are provided so that this disclosure will be thorough and complete, and will fully convey the scope of the inventive concept to one of ordinary skill in the art. Sizes of components in the drawings may be exaggerated for convenience of explanation. In other words, since sizes and thicknesses of components in the drawings are arbitrarily illustrated for convenience of explanation, the following embodiments are not limited thereto. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "formed on" or "contacts" another element, the element may be directly touching or connected to the other element, or intervening elements may be present. However, when an element is referred to as being "directly formed on" or "directly contacts" another element, intervening elements may not be present. Other expressions that describe relationships between elements, such as "between" and "directly between," may also be understood similarly to the above description.

It will be understood that although the terms "first," "second," etc. may be used herein to describe various elements, these elements should not be limited by these terms. The terms are only used to distinguish one element from another. For example, within the scope of the present inventive concept, a first element may be referred to as a second element, and vice versa.

An expression used in the singular encompasses the expression of the plural, unless it has a clearly different meaning in the context. In the present specification, it is to be understood that the terms such as "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Unless defined otherwise, all terms used in the exemplary embodiments have the same meaning as generally understood by one of ordinary skill in the art.

Unless specifically indicated in the exemplary embodiments, a vertical direction and a horizontal direction respectively refer to directions vertical and horizontal to a main surface of a package substrate. Also, unless specifically indicated in the exemplary embodiments, a lower surface of an element stacked on the package substrate refers to a surface facing the package substrate, and an upper surface of the element refers to a surface opposite to the surface of the element, which faces the package substrate.

Hereinafter, the exemplary embodiments will be described in detail with reference to the accompanying drawings.

FIG. 1 is a cross-sectional view of a semiconductor package 1a attached to a main board 750, according to an exemplary embodiment.

Referring to FIG. 1, the semiconductor package 1a according to an embodiment may be attached to the main board 750 via a connection pad 752a and a connection terminal 20 on an upper surface of the main board 750.

The semiconductor package 1a may have a structure that is formed by positioning a first semiconductor chip 100a and a conductive spacer 140 on a package substrate 10 and stacking a second semiconductor chip 200a on the first semiconductor chip 100a and the conductive spacer 140. A second bonding wire 630 may be used to connect bonding pads 202a, 302a, 402a, and 502a of second, third, fourth, and fifth semiconductor chips 200a, 300a, 400a, and 500a. A molding unit 710 may protect the first to fifth semiconductor chips 100a, 200a, 300a, 400a, and 500a and a first bonding wire 610 and the second bonding wire 630 from an external environment. Also, an electromagnetic interference (EMI) shield 730 may be constructed and arranged to cover an external surface of the molding unit 710 and side surfaces of the package substrate 10.

When the semiconductor package 1a is mounted in an electronic device that includes the main board 750, electromagnetic waves emitted from the semiconductor package 1a may be transmitted to other electronic components mounted in the electronic device and thus cause EMI. Accordingly, electromagnetic wave noise may be generated in the electronic device that includes the semiconductor package 1a or the electronic device may malfunction. Thus, the reliability of the electronic device may be decreased. The semiconductor package 1a that has recently been developed. that is, the semiconductor package 1a that has a fast response speed and large capacity may have greater problems related to the EMI caused by the emission of electromagnetic waves. Therefore, the EMI shield 730 is provided to prevent electromagnetic waves, which are inevitably generated during operations of the semiconductor package 1a according to an embodiment, from affecting, for example, interfering with, other electronic components.

In order to increase an EMI shielding effect, the EMI shield 730 may be electrically connected to the connection terminal 20. The main board 750 and the package substrate 10 may be attached to each other via a conductive bump, e.g., a solder ball, which is formed as the connection terminal 20 between the connection pad 752a in the upper surface of the main board 750 and a ground pad 18 in a lower surface of the package substrate 10.

The EMI shield 730 may be electrically connected to the conductive spacer 140. The conductive spacer 140 may be electrically connected to a ground pad 14 on an upper surface of the package substrate 10. The ground pad 14 may be electrically connected to the ground pad 18 in a lower surface of the package substrate 10 via a ground via 16. The ground pad 18 may be electrically connected to the connection terminal 20. The connection terminal 20 may be electrically connected to the connection pad 752a in the upper surface of the main board 750. Thus, the EMI shield 730 may be grounded, for example, to an external ground source such as the outside.

FIGS. 2 to 11 are drawings of an order of manufacturing the semiconductor package 1a, according to an exemplary embodiment. In describing FIGS. 2-11, reference may be made to elements of FIG. 1.

Figure 2:
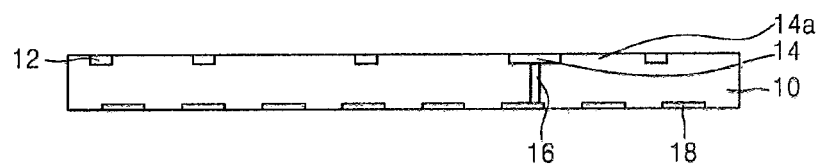
FIGS. 2 to 11 are drawings of an order of manufacturing a semiconductor package, according to an exemplary embodiment.

Referring to FIG. 2, a signal pad 12 and a ground pad 14 may be formed in the upper surface of the package substrate 10, for example, each extending along a common axis extending along the upper surface of the substrate 10. A solder resist 14a may surround the signal pad 12 and the ground pad 14 at the upper surface of the substrate 10. Another ground pad 18 may be provided at the lower surface of the package substrate 10. A ground via 16 may be provided to electrically connect the ground pad 14 in the upper surface of the package substrate 10 and the ground pad 18 in the lower surface of the package substrate 10. The package substrate 10 may be a double-sided printed circuit board (PCB). However, the package substrate 10 is not limited to a double-sided PCB. For example, the package substrate 10 may also be a multi-layer PCB.

Figure 3:
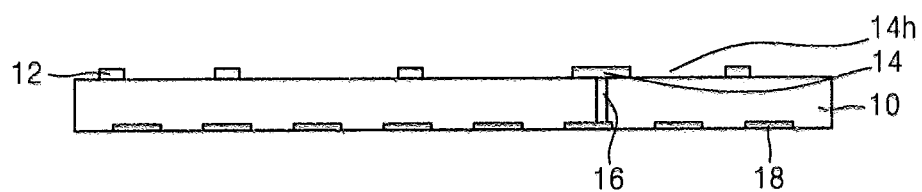

Referring to FIG. 3, a portion of the solder resist 14a, which surrounds the ground pad 14 in the upper surface of the package substrate 10, may be removed, thereby forming an open area 14h at the region of the package substrate 10 where the solder resist 14a formerly was located when the portion of the solder resist 14a is removed.

Figure 4:
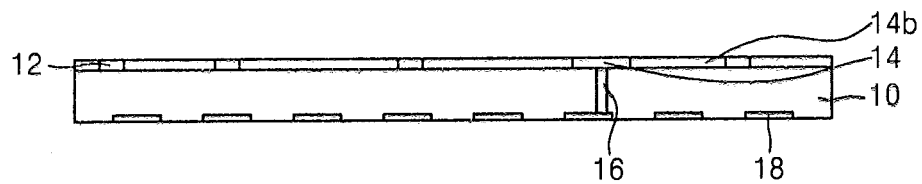

Referring to FIG. 4, the open area 14h, which is formed by removing the portion of the solder resist 14a, is covered with an adhesive 14b. An upper surface of the ground pad 14 remains exposed after application of the adhesive 14b to the open area 14a.

The adhesive 14b may be a die attach film (DAF). The DAF may include an inorganic adhesive or a polymer adhesive. The polymer adhesive may include a thermosetting polymer and a thermoplastic polymer. The thermosetting polymer may have a 3-dimensional cross-link structure after monomers are heated and molded, and may not soften even when the thermosetting polymer is reheated. On the other hand, the thermoplastic polymer displays characteristics related to plasticity by heating and may have a linear polymer structure. A hybrid polymer may be formed by combining the two types of polymers, i.e., a thermosetting polymer and a thermoplastic polymer.

The open area 14h, which is formed by removing portion of the solder resist 14a, may be filled by the DAF 14b so that the ground pad 14 in the upper surface of the package substrate 10 is electrically connected to the conductive spacer 140 when the conductive spacer 140 (described below) is attached to the package substrate 10.

In the related art, the package substrate 10 that includes the solder resist 14a may be attached to the conductive spacer 140 by using an adhesive. If the adhesive is not conductive, an additional process may be necessary to form a conductive path, such as a bonding wire, to electrically connect the conductive spacer 140 and the ground pad 14.

According to some embodiments, the solder resist 14a may be partially removed or completely removed.

Figure 5:
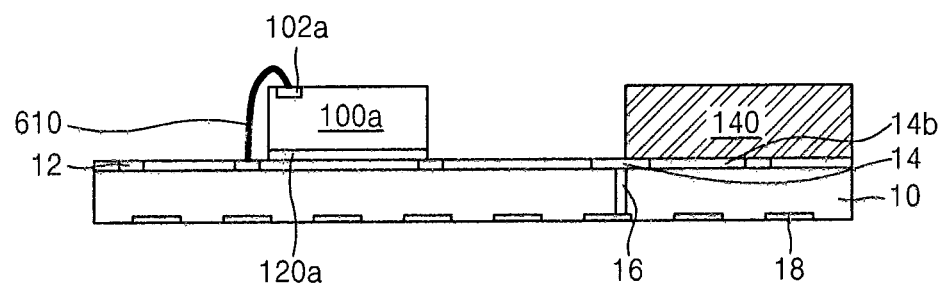

Referring to FIG. 5, a conductive spacer 140 and a first semiconductor chip 100a are disposed on the package substrate 10.

Recently, the demand for mobile devices has rapidly increased in the electronic device markets. Accordingly, there is a continuous demand for electronic components mounted in mobile devices to be small and lightweight. In order to do satisfy this demand, it is necessary to develop not only technology for reducing respective sizes of mounted components, but also, system-on-chip (SOC) technology for integrating a plurality of individual components into a single chip or system-in-package (SIP) technology for integrating a plurality of individual components into a single package.

Therefore, according to exemplary embodiments, a lightweight, slim, and simple semiconductor package may be manufactured by stacking semiconductor chips like a dolmen by using the first semiconductor chip 100a and the conductive spacer 140 on the upper surface of the package substrate 10, unlike a structure formed by stacking semiconductor chips as in the related art.

According to an embodiment, the first semiconductor chip 100a may be constructed and arranged as a controller chip. If a controller chip that is smaller than a memory chip is stacked at an uppermost region away from the package substrate 10, a bonding wire that connects the controller chip and the package substrate 10 may be long, and thus, operation properties of a device may be declined. Therefore, the first semiconductor chip 100a may be stacked on the package substrate 10 so that the controller chip is disposed at a lowermost area, that is, an area nearest to the package substrate 10.

However, as described above, since a controller chip is smaller than a memory chip in general, a structural problem may occur if a memory chip is directly stacked on a controller chip. This problem is solved by forming the controller chip and a spacer that functions as a supporting unit on the package substrate 10. Since the spacer generally functions only as a supporting unit, a silicon substrate may be processed such that a height thereof is the same as a height of the controller chip and forms part of a dolmen structure.

According to an embodiment, the spacer may be formed of a conductive material, for example, a metal with excellent electrical conductivity characteristics, and is strong enough to function as a supporting unit, so that the spacer may function as a supporting unit and a path through which electricity flows. Therefore, according to an embodiment, the spacer is referred to as the conductive spacer 140.

Also, the ground pad 14 in the upper surface of the package substrate 10 may be electrically connected to the spacer by forming the adhesive 14b around the ground pad 14, instead of using an adhesive layer as in the related art.

The height of the conductive spacer 140 may be the same as the first semiconductor chip 100a so that the conductive spacer 140 may function as a supporting unit. The conductive spacer 140 may be formed to contact at least one portion of the ground pad 14 such that the conductive spacer 140 is connected to a molding unit (for example, 710 of FIG. 9) in a subsequent process.

A first adhesive layer 120a may be provided under the first semiconductor chip 100a. Since the adhesive 14b is formed on the upper surface of the package substrate 10 according to an embodiment, a process of forming the first adhesive layer 120a under the first semiconductor chip 100a may be omitted.

Figure 21:
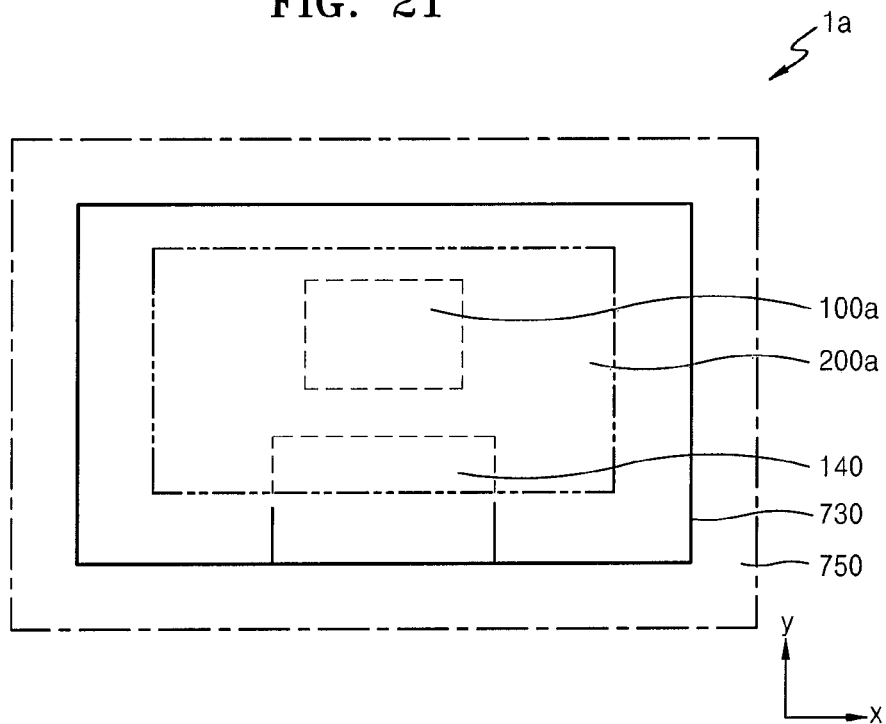
FIGS. 21 and 22 are plan layout views schematically illustrating a semiconductor package according to an exemplary embodiment.
Figure 22:
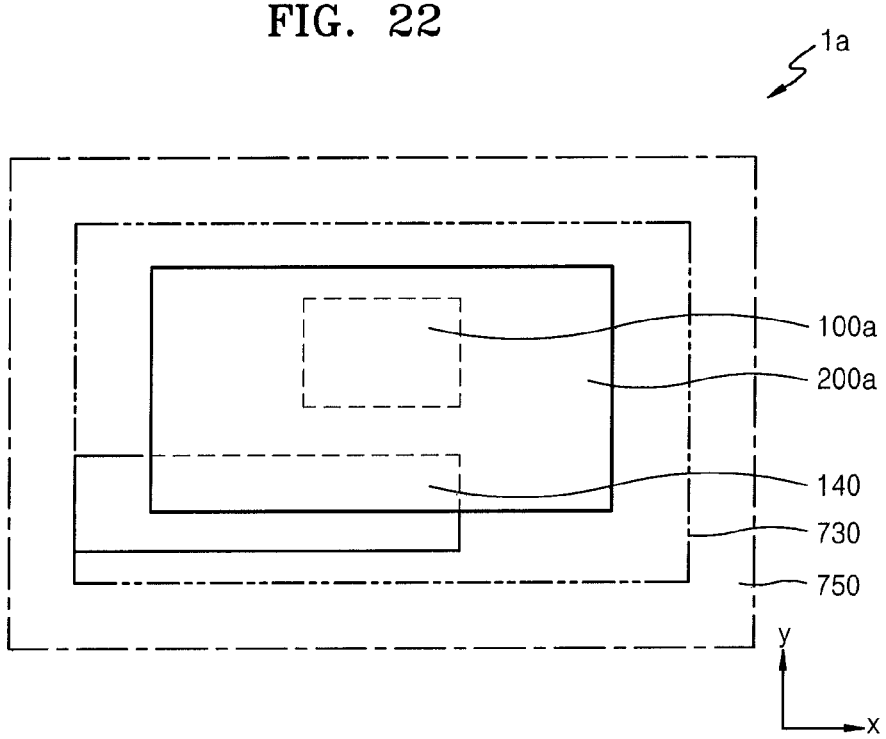

The first bonding wire 610 may connect the bonding pad 102a in an upper surface of the first semiconductor chip 100a to the signal pad 12 of the package substrate 10. As described above, the first semiconductor chip 100a, for example, a controller chip, is generally smaller than a memory chip, that is, a second semiconductor chip (200a of FIG. 6). Therefore, a top surface of the first semiconductor chip 100a may be completely covered by the second semiconductor chip (200a of FIG. 6), as shown in FIGS. 21 and 22 that will be described later. In this case, the first bonding wire 610 may not be formed after the second semiconductor chip (200a of FIG. 6) is stacked. Therefore, unlike the second semiconductor chip (200a of FIG. 6), in a first step, the first semiconductor chip 100a may be disposed on the package substrate 10, and then in a subsequent second step, the first bonding wire 610 may be formed, i.e., before the second semiconductor chip (200a of FIG. 6) is stacked.

Figure 6:
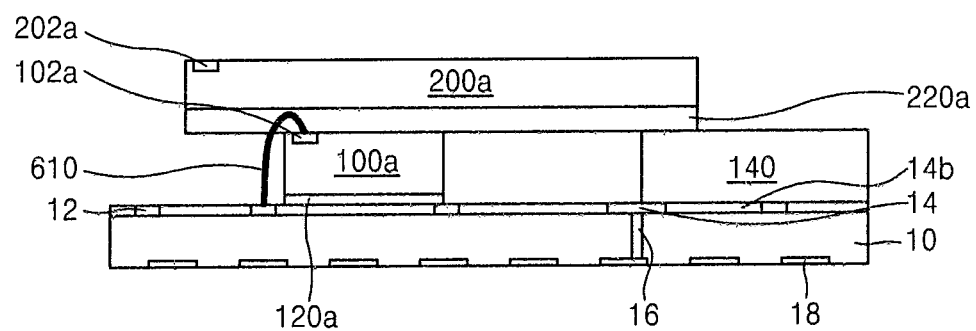

Referring to FIG. 6, a second adhesive layer 220a may be formed to be thicker than other adhesive layers, the reasons for which are as follows:

A first reason is to prevent a modification of a loop shape of the first bonding wire 610 on the first semiconductor chip 100a. As described above, since the first bonding wire 610 is below a lower surface of the second semiconductor chip 200a by being formed first, in order to prevent mechanical modification of the first bonding wire 610, a thickness of the second adhesive layer 220a may be greater than a thickness of the first bonding wire 610 having a loop shape.

A second reason is to reduce a height difference between the first semiconductor chip 100a and the conductive spacer 140. Even when the conductive spacer 140 is manufactured with respect to a thickness of the first semiconductor chip 100a, a difference may be formed due to an inclusion or exclusion of an adhesive layer and other inevitable reasons. Since the structural stability of the second semiconductor chip 200a may have a problem due to the difference, the second adhesive layer 220a may be applied between the first semiconductor chip 100a and the second semiconductor chip 200a to reduce the difference.

The second semiconductor chip 200a may cover only a portion of the conductive spacer 140. Since the conductive spacer 140 has to be electrically connected to an EMI shield (730 of FIG. 10), the conductive spacer 140 is disposed such that the conductive spacer 140 contacts an edge of the package substrate 10. Therefore, the second semiconductor chip 200a does not completely cover the conductive spacer 140, but only covers a portion of the conductive spacer 140.

Figure 7:
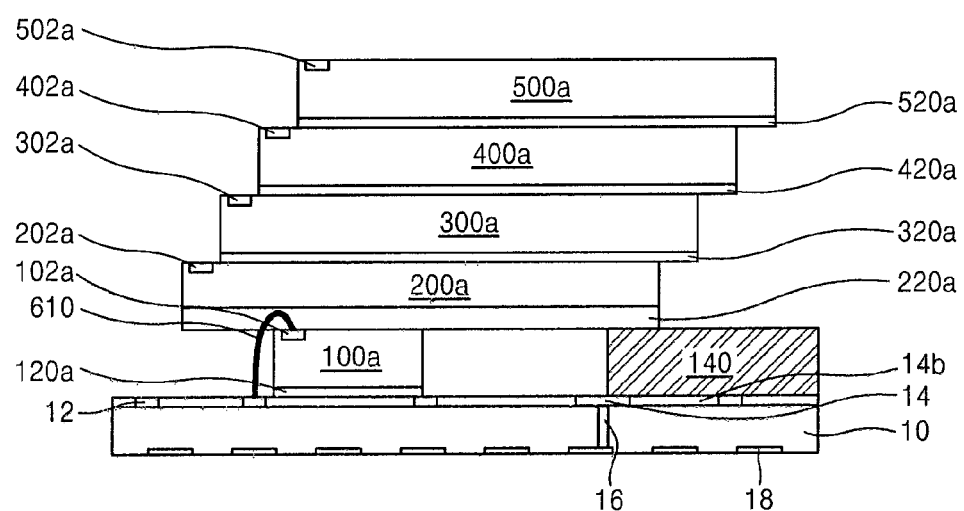

Referring to FIG. 7, third, fourth, and fifth semiconductor chips 300a, 400a, and 500a are stacked on the second semiconductor chip 200a, which in turn is on the first semiconductor chip 100a. The second, third, fourth, and fifth semiconductor chips 200a, 300a, 400a, and 500a may be sequentially stacked on the package substrate 10 and offset from each other in a horizontal direction by a predetermined distance so that the bonding pads 102a, 202a, 302a, and 402a in a portion of upper surfaces of the second, third, fourth, and fifth semiconductor chips 200a, 300a, 400a, and 500a, respectively, are exposed In consideration of SIP technology, which is used to integrate a plurality of individual devices into a single package, the number of semiconductor chips may vary depending on a purpose of a semiconductor package. However, the number of semiconductor chips in exemplary embodiments of the present inventive concept is not limited to the ones shown, and more or less semiconductor chips than the ones shown may be included.

Figure 8:
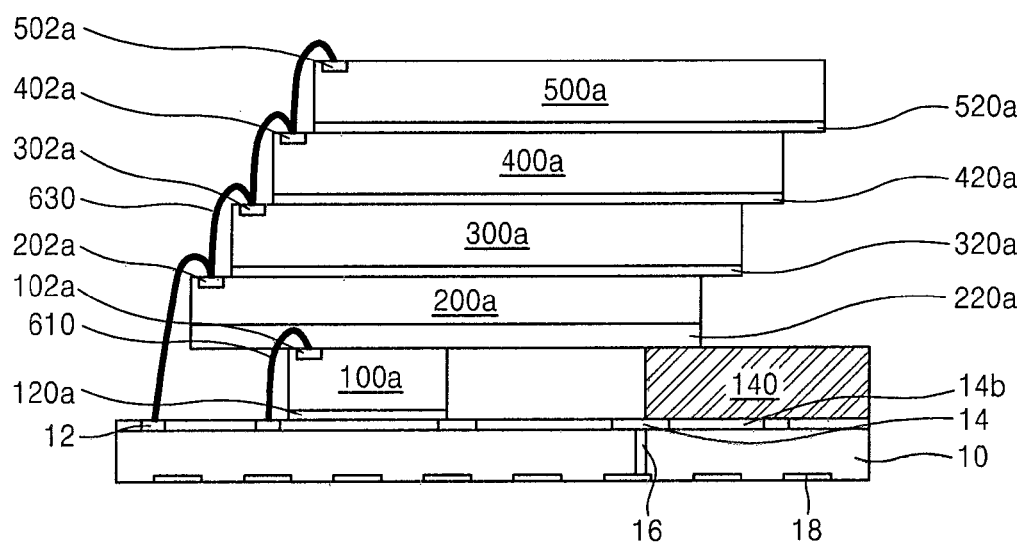

Referring to FIG. 8, a second bonding wire 630 may connect the respective bonding pads 202a, 302a, 402a, and 502a of the second, third, fourth, and fifth semiconductor chips 200a, 300a, 400a, and 500a with the signal pad 12 of the package substrate 10.

The third semiconductor chip 300a may be stacked on the second semiconductor chip 200a. A third adhesive layer 320a may be applied to attach the third semiconductor chip 300a to the second semiconductor chip 200a. According to an embodiment, the third adhesive layer 320a may include an adhesion film or an adhesion sheet that covers a lower surface of the third semiconductor chip 300a. Alternatively, the third adhesive layer 320a may include at least one conductive bump at the lower surface of the third semiconductor chip 300a. At least one bonding pad 302a may be at an upper surface of the third semiconductor chip 300a. According to exemplary embodiments, the bonding pad 302a may be electrically connected to the bonding pad 202a formed in the second semiconductor chip 200a via the second bonding wire 630.

A redistributed layer (RDL) may be formed to stack semiconductor chips as a stair structure. If the semiconductor chips are stacked with a bonding pad located at the center of each semiconductor chip, then a semiconductor package may have problems such as a complicated structure, a long bonding wire, and poor device quality. In order to solve these problems, locations of the bonding pads may be changed from the center to a peripheral area of each semiconductor chip so that the semiconductor chips may be easily stacked. A degree of freedom for a bonding wire looping may be increased with respect to the manufacturing of a semiconductor package.

Figure 9:
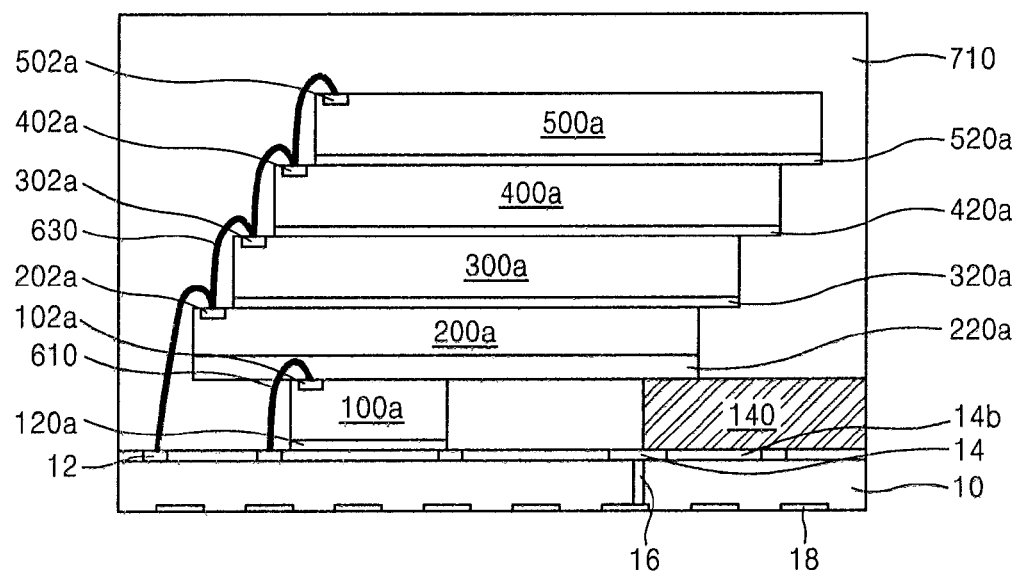

Referring to FIG. 9, a molding unit 710 may be constructed and arranged cover the package substrate 10 and the first to fifth semiconductor chips 100a, 200a, 300a, 400a.

The molding unit 710 may be formed on the upper surface of the package substrate 10 and cover the first to fifth semiconductor chips 100a, 200a, 300a, 400a, and 500a, the first and second bonding wires 610 and 630, and the conductive spacer 140. The molding unit 710 may protect the first to fifth semiconductor chips 100a, 200a, 300a, 400a, and 500a and the first and second bonding wires 610 and 630 from the external environment. According to an embodiment, the molding unit 710 may include epoxy molding compound (EMC).

According to an embodiment of the present inventive concept, a portion of the conductive spacer 140 is exposed, for example, a sidewall of the conductive spacer 140, even though the molding unit 710 may cover all other components disposed on the upper surface of the package substrate 10 overall. This is because the conductive spacer 140 and an EMI shield (730 of FIG. 10) have to be electrically connected and function as a ground path.

Figure 10:
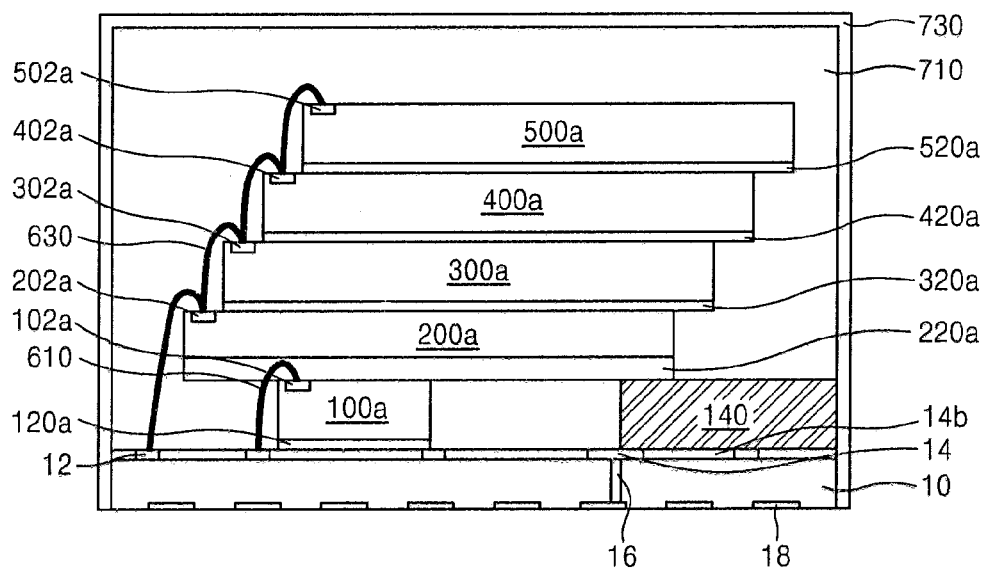

Referring to FIG. 10, the EMI shield 730 may cover the molding unit 710 and may be electrically connected to the conductive spacer 140, for example, a sidewall of the conductive spacer 140.

The EMI shield 730 may cover an upper surface and side surfaces of the molding unit 710. That is, the EMI shield 730 may cover the upper surface and the side surfaces of the molding unit 710 and side surfaces of the package substrate 10. A portion of the conductive spacer 140 on the upper surface of the package substrate 10, that is, the portion that is exposed from the molding unit 710, may contact and be electrically connected to the EMI shield 730. The EMI shield 730 may include a conductive material that directly abuts the conductive spacer 140. For example, the conductive material of the EMI shield 730 may include metal such as copper or silver.

Figure 11:
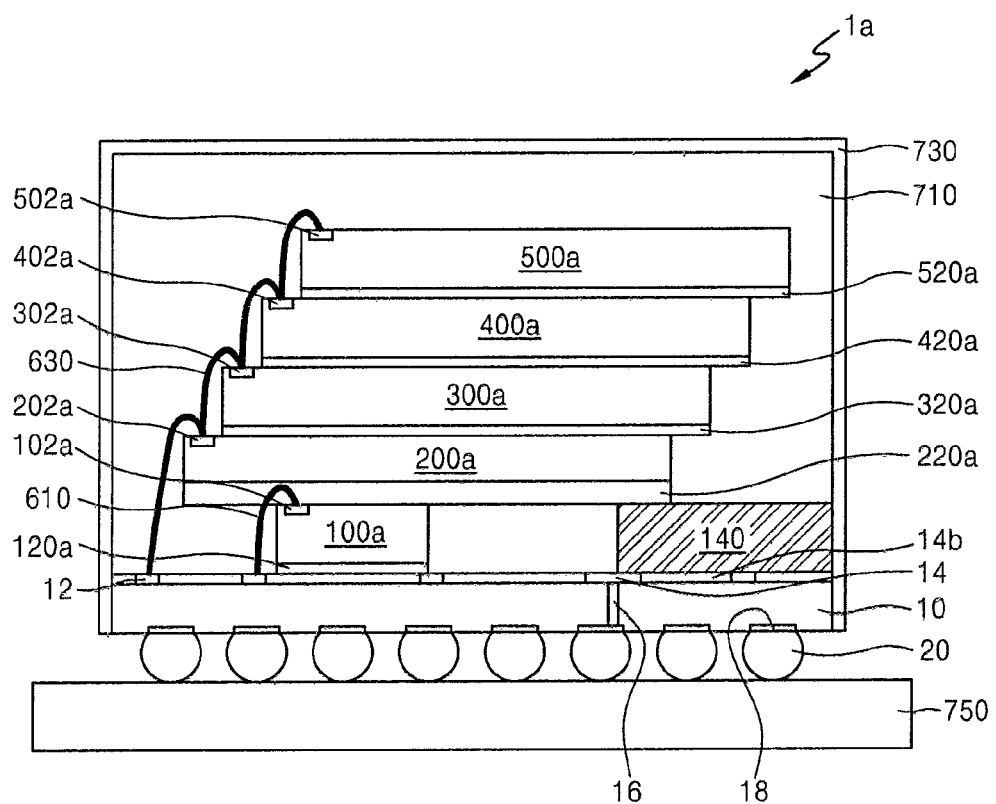

In order to increase an EMI shielding effect, the EMI shield 730 may be electrically connected to a connection terminal (20 of FIG. 11). According to an exemplary embodiment, the EMI shield 730 may be electrically connected to the conductive spacer 140 so that the EMI shield 730 is electrically connected to the connection terminal 20.

The EMI shield 730 may be formed as a metal thin film. The metal thin film may be formed according to a thin film deposition method, for example, a spray coating method, an electroplating method, an electroless plating method, or a sputtering method.

Referring to FIG. 11, a semiconductor package 1a may include a connection terminal 20 on a ground pad 18 in the lower surface of the package substrate 10. According to exemplary embodiments, a conductive bump, e.g., a solder ball, may be formed as the connection terminal 20 on the ground pad 18 in the lower surface of the package substrate 10.

In this embodiment, the EMI shield 730 may be electrically connected to the conductive spacer 140. The conductive spacer 140 may be electrically connected to the ground pad 14 in the upper surface of the package substrate 10. The ground pad 14 may be electrically connected to the ground pad 18 in the lower surface of the package substrate 10 via the ground via 16 extending through the package substrate 10 between the ground pad 14 and the ground pad 18 to which the conductive bump 20 or the like abuts. Accordingly, each of the ground pads 14 and 18 may be electrically connected to the connection terminal 20.

Figure 12:
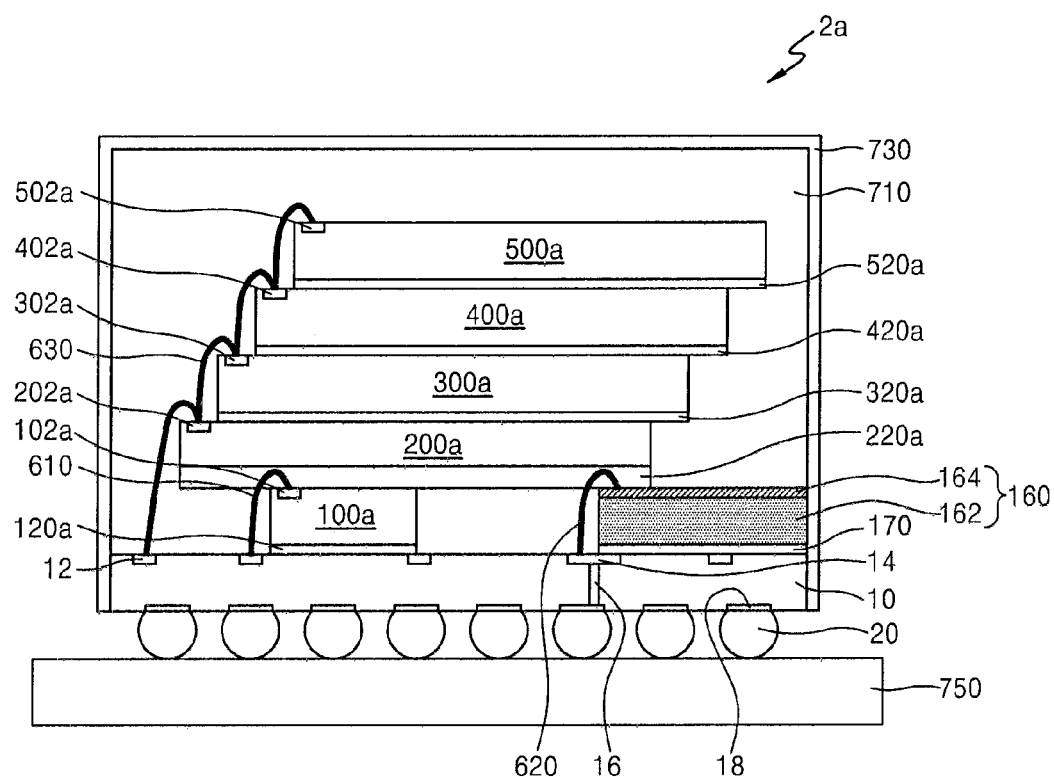
FIG. 12 is a cross-sectional view of a semiconductor package attached to a main board, according to another exemplary embodiment.

FIG. 12 is a cross-sectional view of a semiconductor package 2a attached to a main board 750, according to another exemplary embodiment.

Referring to FIG. 12, the semiconductor package 2a according to another embodiment may be attached to the main board 750 via a connection pad 752a and a connection terminal 20 on an upper surface of the main board 750.

The semiconductor package 2a may have a structure that is formed by disposing a first semiconductor chip 100a and a spacer structure 160 on the package substrate 10 and stacking a second semiconductor chip 200a on the first semiconductor chip 100a and the spacer structure 160. A second bonding wire 630 may connect the bonding pads 202a, 302a, 402a, and 502a of the second, third, fourth, and fifth semiconductor chips 200a, 300a, 400a, and 500a, respectively. A molding unit 710 may be positioned over the substrate 10 to protect the first to fifth semiconductor chips 100a, 200a, 300a, 400a, and 500a, the first bonding wire 610, the second bonding wire 630, and a third bonding wire 620 from an external environment. A EMI shield 730 may cover the external surface of the molding unit 710 and the side surfaces of the package substrate 10.

In order to increase an EMI shielding effect with respect to the semiconductor package 2a, the EMI shield 730 may be electrically connected to the connection terminal 20. The main board 750 and the package substrate 10 may be attached to each other via a conductive bump, e.g., a solder ball, which is formed as the connection terminal 20 between the connection pad 752a in the upper surface of the main board 750 and the ground pad 18 in a lower surface of the package substrate 10.

The EMI shield 730 may be electrically connected to a conductive unit 164. The conductive unit 164 may be electrically connected to the third bonding wire 620. The third bonding wire 620 may be electrically connected to a ground pad 14 at the upper surface of the package substrate 10. The ground pad 14 may be electrically connected to a ground pad 18 in the lower surface of the package substrate 10 via a ground via 16 extending through the package substrate 10. The ground pad 18 in the lower surface of the package substrate 10 may be electrically connected to the connection terminal 20. The connection terminal 20 may be electrically connected to the connection pad 752a in the upper surface of the main board 750. Thus, the EMI shield 730 may be grounded, for example, to an external ground source such as the outside.

FIGS. 13 to 20 are drawings of an order of manufacturing the semiconductor package 2a, according to another exemplary embodiment.

Components and features of the semiconductor package 2a that are substantially the same as those of the semiconductor package 1a will not be repeatedly described. Only differences between the components and features of the semiconductor packages 1a and 2a will be described for reasons related to brevity.

Figure 13:
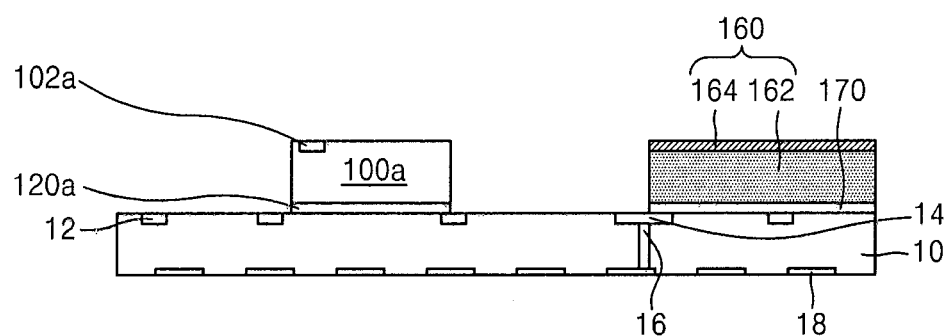
FIGS. 13 to 20 are drawings of an order of manufacturing a semiconductor package, according to another exemplary embodiment.

Referring to FIG. 13, a spacer 162, on which the conductive unit 164 is formed, and the first semiconductor chip 100a may each be disposed on the package substrate 10.

The signal pad 12 and the ground pad 14 may be formed in the upper surface of the package substrate 10. The ground pad 18 may be formed on the lower surface of the package substrate 10. The ground via 16 may electrically connect the ground pad 14 and the ground pad 18. The package substrate 10 may be a double-sided PCB. However, the package substrate 10 is not limited to a double-sided PCB, and may be a multi-layer PCB.

According to another embodiment, the conductive unit 164 may be formed on an upper surface of the spacer 162 that is disposed on the package substrate 10, by using a material with excellent electric conductivity applied according to a metal thin film forming method. The conductive unit 164 may include a metal thin film formed by using a thin film deposition method, for example, a spray coating method, an electroplating method, an electroless plating method, or a sputtering method. The conductive unit 164 may function as a path through which electricity flows.

The height of the spacer structure 160 may be the same as the first semiconductor chip 100a so that and the spacer structure 160 may function as a supporting unit. The spacer structure 160 may be formed such that a portion of the spacer structure 160 contacts a peripheral area of the package substrate 10, and so that at least one portion of the spacer structure 160 is exposed by a molding unit (710 of FIG. 18) in a subsequent process. The spacer 162 may be a general-use silicon substrate.

An adhesive layer may be formed under the first semiconductor chip 100a and the spacer 162. According to an exemplary embodiment, since the semiconductor package 2a is different from the semiconductor package 1a of FIG. 1 in that an adhesive (14b of FIG. 1) is not formed on the package substrate 10, the first semiconductor chip 100a and the spacer 162 may be attached to the package substrate 10 via the adhesive layer that is formed in a lower area thereof. A spacer adhesive layer 170 may be formed under the spacer 162.

Figure 14:
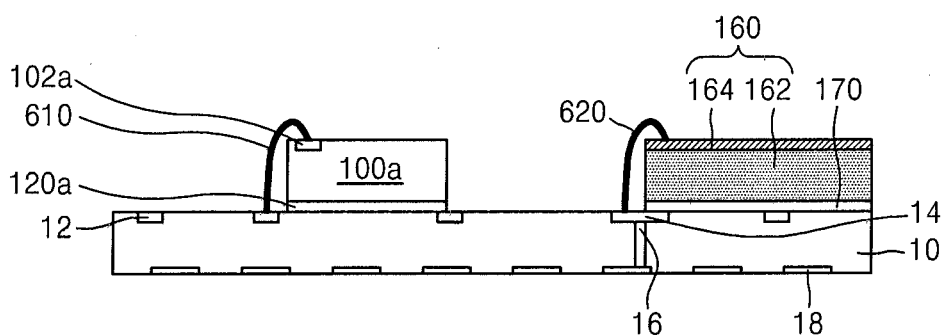

Referring to FIG. 14, one or more bonding wires may be formed on the first semiconductor chip 100a and the spacer structure 160.

A first bonding wire 610 may be formed to connect the bonding pad 102a in the upper surface of the first semiconductor chip 100a to the signal pad 12 of the package substrate 10. A third bonding wire 620 may be formed to connect the conductive unit 164 on the spacer 162 to the ground pad 14. The present embodiment may be different from the semiconductor package 1a of FIG. 1 described above in that the spacer 162 may be a silicon substrate. That is, the silicon spacer 162 may not include a conductive material, and thus, the ground pad 14 may not be directly connected to the conductive unit 164. Therefore, the conductive unit 164 may be electrically connected to the ground pad 14 via the third bonding wire 620.

Figure 15:
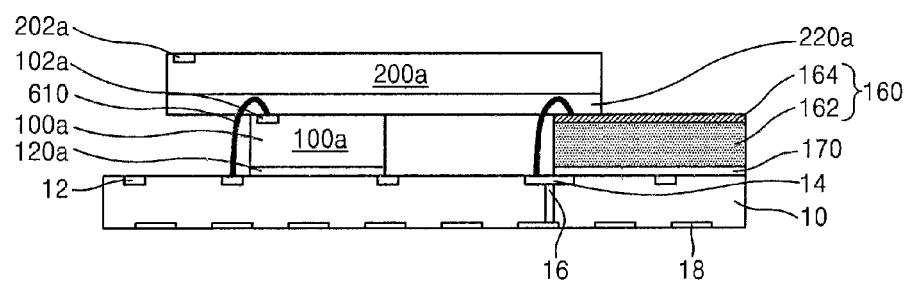

As described above, the first semiconductor chip 100a, for example, a controller chip, is generally smaller than a memory chip, that is, a second semiconductor chip (200a of FIG. 15). Therefore, the first semiconductor chip 100a may be completely covered by the second semiconductor chip (200a of FIG. 15), as shown in FIGS. 21 and 22 that will be described later. In this case, the first and third bonding wires 610 and 620 may not be formed after the second semiconductor chip (200a of FIG. 15) is stacked. Therefore, unlike the second semiconductor chip (200a of FIG. 15), first, the first semiconductor chip 100a may be disposed on the package substrate 10. The first bonding wire 610 may be formed before the second semiconductor chip (200a of FIG. 15) is stacked.

Referring to FIG. 15, the second semiconductor chip 200a may be stacked on the first semiconductor chip 100a and the spacer structure 160. As in the semiconductor package 1a of FIG. 1 of the above-described embodiment, a second adhesive layer 220a between the second semiconductor chip 200a and the first semiconductor chip 100a may be thicker than other adhesive layers in order to reduce a difference between the first semiconductor chip 100a and the spacer structure 160 without modifying loop shapes of the first bonding wire 610 and the third bonding wire 620.

Figure 16:
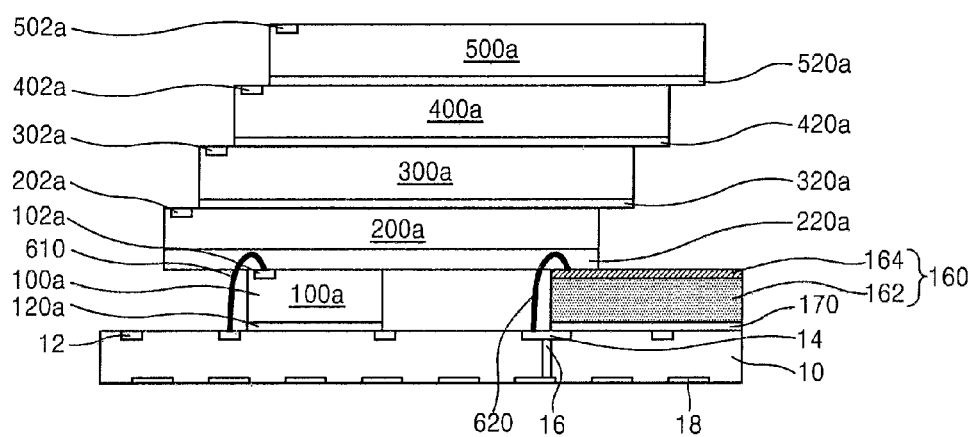

Referring to FIG. 16, the third, fourth, and fifth semiconductor chips 300a, 400a, and 500a may be sequentially stacked on the second semiconductor chip 200a, which in turn may be stacked on the first semiconductor chip 100a. The second, third, fourth, and fifth semiconductor chips 200a, 300a, 400a, and 500a may be sequentially stacked on the package substrate 10 and offset from each other in a horizontal direction by a predetermined distance so that the bonding pads 102a, 202a, 302a, and 402a in a portion of upper surfaces of the second, third, fourth, and fifth semiconductor chips 200a, 300a, 400a, and 500a, respectively, are exposed.

Figure 17:
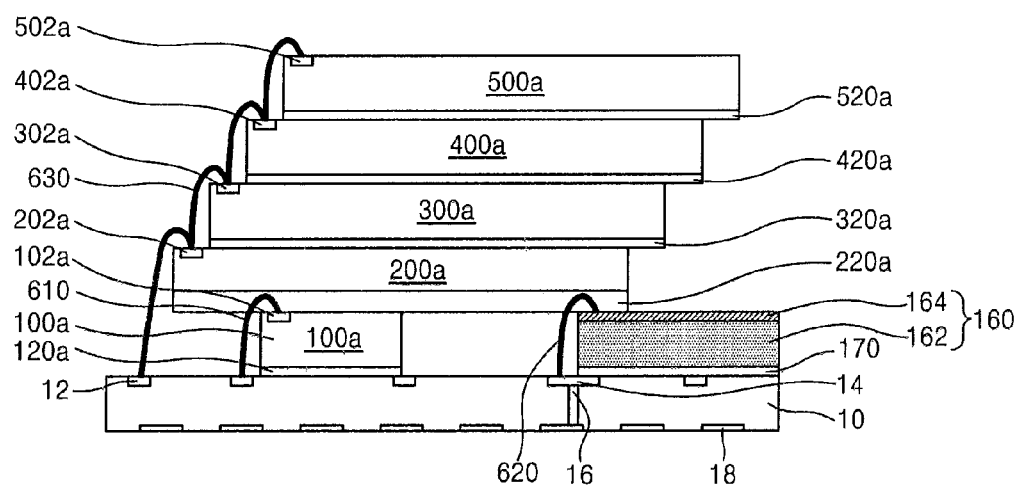

Referring to FIG. 17, a second bonding wire 630 may be formed to connect the respective bonding pads 202a, 302a, 402a, and 502a of the second, third, fourth, and fifth semiconductor chips 200a, 300a, 400a, and 500a with the signal pad 12 of the package substrate 10. In some embodiments, the bonding wire 630 is a single bonding wire that contacts each of the bonding pads 202a, 302a, 402a, and 502a of the second, third, fourth, and fifth semiconductor chips 200a, 300a, 400a, and 500a with the signal pad 12. In other embodiments, one second bonding wire 630 may be formed between two adjacent bonding pads, for example, between bonding pad 402a and 502a, and another second bonding wire 630 may be formed between bonding pads 302a and 402a, and so on. In this example, the bonding wire 630 between bonding pads 302a and 402a may be conductively coupled at the bonding pad 402a to the bonding wire 630 between bonding pads 402a and 502a. Similar connections can occur between other bonding wires 630 so that a conductive path is formed between each bonding pad 202a, 302a, 402a, and 502a and the signal pad 12.

Figure 18:
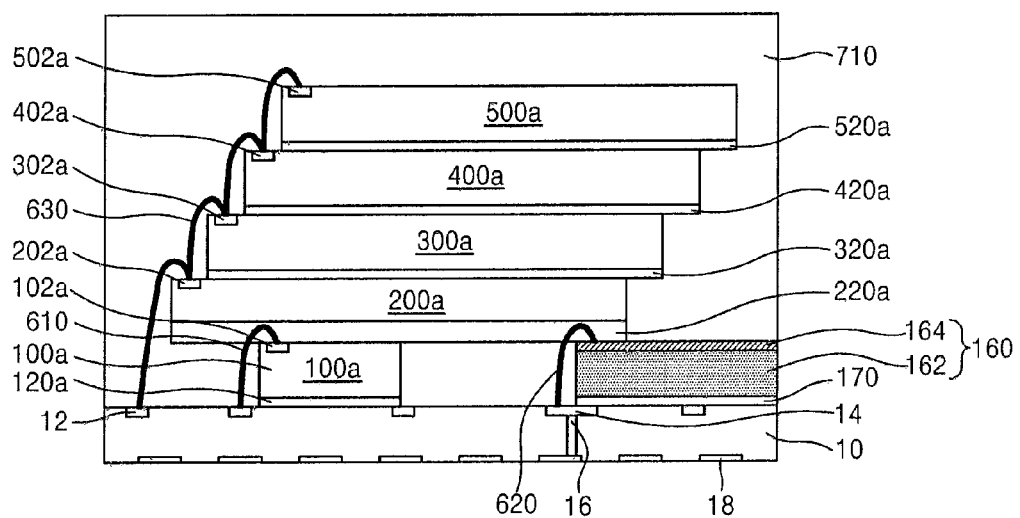

Referring to FIG. 18, the molding unit 710 may cover the package substrate 10 and the first to fifth semiconductor chips 100a, 200a, 300a, 400a, and 500a and expose a portion of the spacer structure 160.

Figure 19:
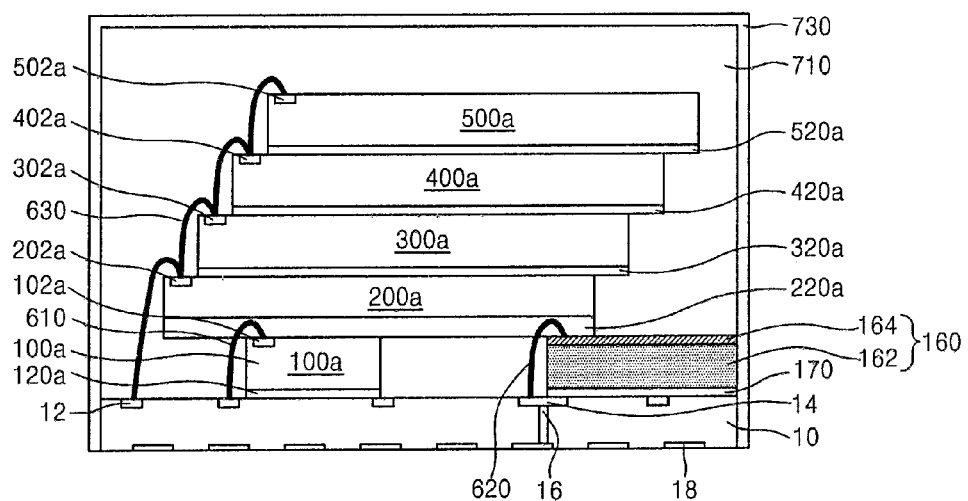

Referring to FIG. 19, the EMI shield 730 may cover the molding unit 710 and may be electrically connected to the conductive unit 164 at the exposed region of the conductive unit 164, i.e., the region not covered by the molding unit 710.

Figure 20:
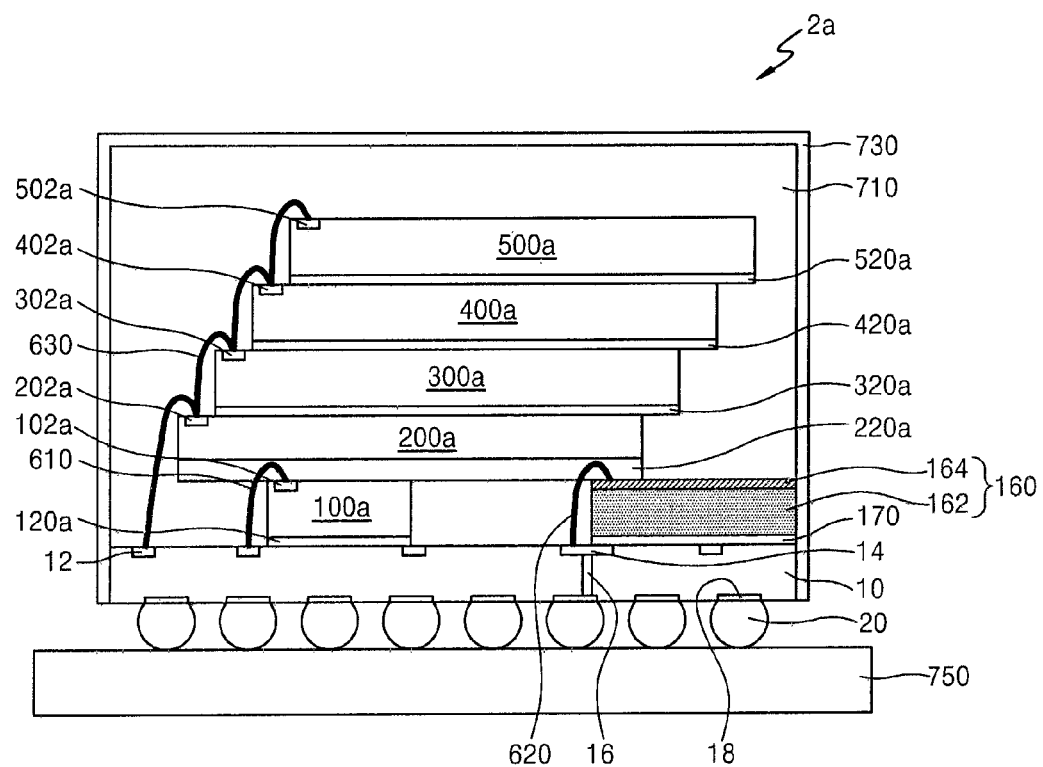

Referring to FIG. 20, the semiconductor package 2a may include a connection terminal 20 on a ground pad 18 in a lower surface of the package substrate 10. According to exemplary embodiments, a conductive bump, e.g., a solder ball, may be formed as the connection terminal 20 on the ground pad 18 in the lower surface of the package substrate 10.

The EMI shield 730 may be electrically connected to the conductive unit 164 of the spacer structure 160. The conductive unit 164 may be electrically connected to the third bonding wire 620. The third bonding wire 620 may be electrically connected to the ground pad 14 in the upper surface of the package substrate 10. The ground pad 14 in the upper surface of the package substrate 10 may be electrically connected to the ground pad 18 in the lower surface of the package substrate 10 via the ground via 16. The ground pad 18 in the lower surface of the package substrate 10 may be electrically connected to the connection terminal 20.

FIGS. 21 and 22 are plan layout views schematically illustrating the semiconductor package 1a according to an exemplary embodiment. In describing FIGS. 21 and 22, reference can be made to elements previously described.

Referring to FIG. 21, relative locations of the second semiconductor chip 200a and the conductive spacer 140 are shown on the package substrate 10. A portion of the conductive spacer 140 may contact the EMI shield 730. Since the conductive spacer 140 may function as a supporting unit of the second semiconductor chip 200a, the conductive spacer 140 may be disposed such that the conductive spacer 140 contacts the EMI shield 730 in a first direction (y direction).

As described above, the memory chip may be directly disposed on the controller chip as a structure shown in FIG. 21, since the controller chip is generally smaller than the memory chip.

Although not illustrated, a structure may be the same as that shown in FIG. 21 even when a conductive unit (e.g., 164 of FIG. 20) is formed on an upper surface of a spacer (e.g., 162 of FIG. 20).

Referring to FIG. 22, relative locations of the second semiconductor chip 200a and the conductive spacer 140 are shown on the package substrate 10. However, the layout of FIG. 22 is different than that of FIG. 21, in particular, due to the location and configuration of the conductive spacer 140. A portion of the conductive spacer 140 may contact the EMI shield 730. Since the conductive spacer 140 may function as a supporting unit of the second semiconductor chip 200a, the conductive spacer 140 may be disposed such that the conductive spacer 140 contacts the EMI shield 730 in a second direction (x direction).

Although not illustrated, the structure may otherwise be the same or similar as that shown in FIG. 22 even when a conductive unit (164 of FIG. 20) is formed on the upper surface of the spacer (162 of FIG. 20).

Figure 23:
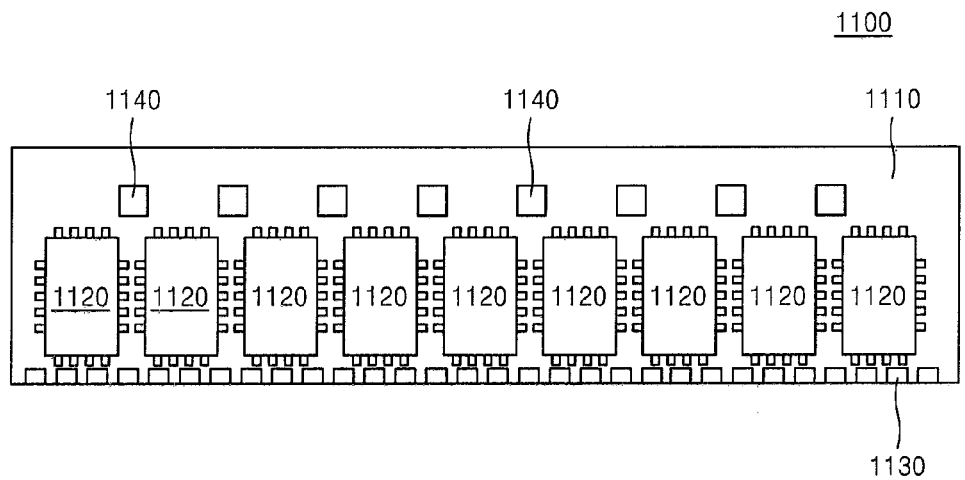
FIG. 23 is a plan view of a memory module including a semiconductor package, according to an exemplary embodiment.

FIG. 23 is a plan view of a memory module 1100 including a previously described semiconductor package 1a or 2a, according to an exemplary embodiment;

Referring to FIG. 23, the memory module 1100 may include a module substrate 1110 and a plurality of semiconductor packages 1120 attached to the module substrate 1110.

Each of the plurality of semiconductor packages 1120 may include a semiconductor package 1a or 2a according to an embodiment. For example, each of the plurality of semiconductor packages 1120 may include the semiconductor package 1a or 2a respectively illustrated in FIGS. 1-11 and 12-20.

A connector 1130 may be disposed at a side of the module substrate 1110 and inserted into a socket of a main board. A ceramic decoupling capacitor 1140 is disposed on the module substrate 1110. The memory module 1100 according to an embodiment is not limited to exemplary components illustrated in FIG. 23, and may be manufactured in various forms.

Figure 24:
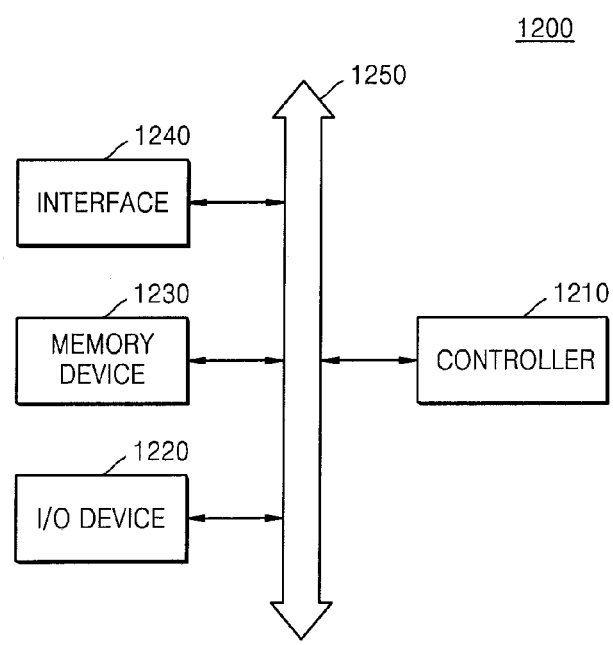
FIG. 24 is a block diagram of a system including a semiconductor package, according to an exemplary embodiment.

FIG. 24 is a block diagram of a system 1200 including a previously described semiconductor package 1a or 2a, according to an exemplary embodiment.

Referring to FIG. 24, the system 1200 may include a controller 1210, an input/output (I/O) device 1220, a memory device 1230, and an interface 1240. The system 1200 may be a mobile system or a system for transmitting or receiving information. According to some embodiments, the mobile system may be used in a personal digital assistant (PDA), a portable computer, a web tablet, a wireless phone, a mobile phone, a digital music player, or a memory card. The controller 1210 may control an executed program in the system 1200 and may include a microprocessor, a digital signal processor, a microcontroller, or the like. The I/O device 1220 may be used to input or output data of the system 1200. The system 1200 may be connected to an external device, for example, a personal computer or a network, via the I/O device 1220, and exchange data with the external device. The I/O device 1220 may be, for example, a keypad, a keyboard, or a display.

The memory device 1230 may store programming code and/or data for operations of the controller 1210, or store data processed in the controller 1210. The memory device 1230 may include a semiconductor package according to an exemplary embodiment. For example, the memory device 1230 may include the semiconductor package 1a or 2a respectively shown in FIGS. 1 and 12.

The interface 1240 may provided a data transmission path between the system 1200 and an external device. The controller 1210, the I/O device 1220, the memory device 1230, and the interface 1240 may communicate via a bus 1250. The system 1200 may be used in a mobile phone, an MP3 player, a navigation system, a portable multimedia player (PMP), a solid state disk (SSD), or household appliances.

Figure 25:
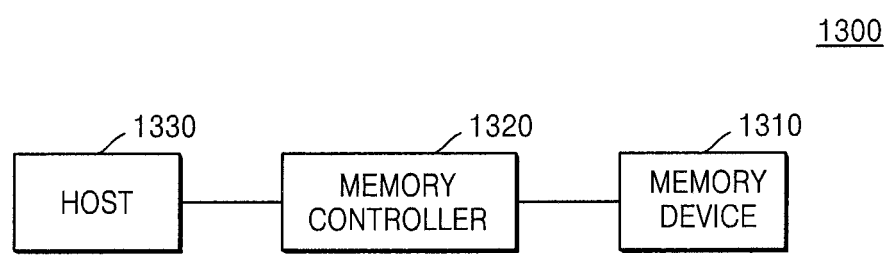
FIG. 25 is a block diagram of a memory card including a semiconductor package, according to an exemplary embodiment.

FIG. 25 is a block diagram of a memory card 1300 including the semiconductor package 1a or 2a, according to an exemplary embodiment.

Referring to FIG. 25, the memory card 1300 may include a memory device 1310 and a memory controller 1320.

The memory device 1310 may store data. According to some embodiments, the memory device 1310 may be non-volatile, that is, may retain stored data even when power is not supplied. The memory device 1310 may include a semiconductor package according to an exemplary embodiment. For example, the memory device 1310 may include the semiconductor package 1a or 2a respectively shown in FIGS. 1-11 and 12-20.

The memory controller 1320 may read data stored in the memory device 1310 or store data in the memory device 1310 in response to a read/write request from a host 1330.

While the inventive concept has been particularly shown and described with reference to exemplary embodiments thereof, it will be understood that various changes in form and details may be made therein without departing from the spirit and scope of the following claims.

What is claimed is:

1. A semiconductor package comprising:
a package substrate comprising a ground pad;
a conductive spacer and a first semiconductor chip disposed on the package substrate;
a second semiconductor chip on the conductive spacer and the first semiconductor chip;
a molding unit that covers a top portion of the package substrate, the first semiconductor chip, the second semiconductor chip, and a first portion of the conductive spacer, and exposes a second portion of the conductive spacer; and
an electromagnetic interference (EMI) shield that covers the molding unit, side portions of the package substrate, and the exposed second portion of the conductive spacer.

2. The semiconductor package of claim 1, wherein the second portion of the conductive spacer is electrically connected to the EMI shield.

3. The semiconductor package of claim 1, wherein a lower surface of the conductive spacer is electrically connected to the ground pad.

4. The semiconductor package of claim 1, further comprising an adhesive disposed around the ground pad and attaching the conductive spacer to the package substrate.

5. The semiconductor package of claim 1, wherein a height of the conductive spacer is the same as a height of the first semiconductor chip.

6. The semiconductor package of claim 1, wherein the package substrate is a double-sided printed circuit board.

7. The semiconductor package of claim 1, wherein the EMI shield covers an external surface of the molding unit and a side surface of the package substrate.

8. The semiconductor package of claim 1, wherein a portion of the conductive spacer overlaps the second semiconductor chip.

9. The semiconductor package of claim 1, wherein the first semiconductor chip is a controller chip.

10. The semiconductor package of claim 1, further comprising a connection terminal that is attached to a lower surface of the package substrate and electrically connected to another ground pad.

11. A semiconductor package comprising:
a package substrate comprising a ground pad;
a spacer disposed on the package substrate;
a conductive unit on the spacer;
a first semiconductor chip disposed on the package substrate such that the first semiconductor chip is separated from the spacer;
a second semiconductor chip on the spacer and the first semiconductor chip;
a molding unit that covers a top portion of the package substrate, the first semiconductor chip, the second semiconductor chip, and a first portion of the spacer, and a exposes a second portion of the conductive unit; and
an electromagnetic interference (EMI) shield that covers side portions of the package substrate and an external surface of the molding unit.

12. The semiconductor package of claim 11, wherein the second portion of the conductive unit is covered by the EMI shield.

13. The semiconductor package of claim 11, further comprising a bonding wire that electrically connects the conductive unit and the ground pad.

14. The semiconductor package of claim 13, further comprising a ground via that is formed inside the package substrate and electrically connected to the ground pad.

15. The semiconductor package of claim 11, wherein the EMI shield covers the external surface of the molding unit and a side surface of the package substrate.

16. A semiconductor package, comprising:
a package substrate;
a first semiconductor chip on the package substrate;
a conductive spacer comprising a conductive material, and adjacent the first semiconductor chip on the package substrate;
a second semiconductor chip on the first semiconductor chip and a first portion of the conductive spacer; and
an electromagnetic interference (EMI) shield around and covering the package substrate, the first semiconductor chip, the second semiconductor chip, and the conductive spacer, and electrically connecting to a second portion of the conductive spacer, such that the conductive spacer provides a ground path for the EMI shield.

17. The semiconductor package of claim 16, further comprising a molding unit under the EMI shield, the molding unit covering a top portion of the package substrate, the first semiconductor chip, the second semiconductor chip, and the first portion of the conductive spacer, and exposing the second portion of the conductive spacer.

18. The semiconductor package of claim 16, further comprising a first ground pad at a first side of the package substrate electrically connected to the conductive spacer, a second ground pad on a second side of the package substrate opposite the first side, and a ground via extending through the package substrate between the first ground pad and the second ground pad for electrically connecting the first ground pad and the second ground pad.

19. The semiconductor package of claim 16, further comprising a connection terminal that is attached to a lower surface of the package substrate and electrically connected to the second ground pad.

20. The semiconductor package of claim 16, wherein a portion of the conductive spacer overlaps the second semiconductor chip.

* * * * *